(12) United States Patent
Li

(10) Patent No.: US 10,755,935 B2
(45) Date of Patent: Aug. 25, 2020

(54) SEMICONDUCTOR DEVICE AND FABRICATION METHOD THEREOF

(71) Applicants:Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/974,476

(22) Filed: May 8, 2018

(65) Prior Publication Data

US 2018/0330953 A1 Nov. 15, 2018

(30) Foreign Application Priority Data

May 9, 2017 (CN) .......................... 2017 1 0321505

(51) Int. Cl.
*H01L 21/28* (2006.01)
*H01L 21/02* (2006.01)
*H01L 21/8234* (2006.01)
*H01L 29/66* (2006.01)
(Continued)

(52) U.S. Cl.
CPC .... *H01L 21/28247* (2013.01); *H01L 21/0214* (2013.01); *H01L 21/02129* (2013.01); *H01L 21/823456* (2013.01); *H01L 21/823462* (2013.01); *H01L 27/088* (2013.01);
(Continued)

(58) Field of Classification Search
CPC ......... H01L 21/28247; H01L 21/02129; H01L 21/0214; H01L 21/823456; H01L 21/823462; H01L 27/088; H01L 29/66545; H01L 29/66795; H01L 29/785
See application file for complete search history.

(56) References Cited

U.S. PATENT DOCUMENTS

| | | | |
|---|---|---|---|
| 2007/0057331 A1* | 3/2007 | Satou | ................ H01L 21/28097 257/384 |
| 2012/0139061 A1* | 6/2012 | Ramachandran | ............................ H01L 21/76895 257/410 |
| 2015/0084132 A1* | 3/2015 | Chou | .................... H01L 29/518 257/369 |

FOREIGN PATENT DOCUMENTS

CN 105810565 A 7/2016

* cited by examiner

*Primary Examiner* — Matthew L Reames
(74) *Attorney, Agent, or Firm* — Anova Law Group, PLLC

(57) ABSTRACT

A semiconductor device and fabrication method are provided. The method includes providing a first dielectric layer with a first groove on a base substrate. A first gate electrode is formed in the first groove, with a top surface lower than the first dielectric layer. A first protective layer is formed on a portion of the top surface of the first gate electrode, with a first oxygen ionic concentration. A compensating protective layer is formed on a remaining portion of the top surface of the first gate electrode exposed by the first protective layer, with a second oxygen ionic concentration. A second dielectric layer is formed on the first protective layer, on the compensating protective layer, and on the first dielectric layer, with a third oxygen ionic concentration. The first oxygen ionic concentration and second oxygen ionic concentration are smaller than the third oxygen ionic concentration.

19 Claims, 7 Drawing Sheets

(51) Int. Cl.
*H01L 29/78* (2006.01)
*H01L 27/088* (2006.01)
(52) U.S. Cl.
CPC .. *H01L 29/66545* (2013.01); *H01L 29/66795* (2013.01); *H01L 29/785* (2013.01)

SEMICONDUCTOR DEVICE AND FABRICATION METHOD THEREOF

CROSS-REFERENCES TO RELATED APPLICATION

This application claims the priority of Chinese Patent Application No. 201710321505.1, filed on May 9, 2017, the content of which is incorporated by reference in its entirety.

TECHNICAL FIELD

The present disclosure generally relates to the field of semiconductor technologies and, more particularly, relates to a semiconductor device and its fabrication method.

BACKGROUND

A metal-oxide-semiconductor (MOS) transistor is one of the most important devices in modern integrated circuits. A MOS transistor usually includes: a semiconductor substrate; a gate structure on the surface of the semiconductor substrate; a source in the semiconductor substrate on one side of the gate structure; and a drain in the semiconductor substrate on another side of the gate structure. The MOS transistor regulates currents in a channel under the gate structure by applying a voltage on the gate structure, to generate on/off signals.

As continuous developments of the semiconductor technology, the controlling ability of conventional planar MOS transistors on the channel currents becomes weaker, subsequently causing serious leakage current problems. To better adapt to the decreased size of the devices, focuses of the semiconductor technology have gradually changed from planar MOSFETs to more effective non-planar three-dimensional transistors, such as multi-gate devices including fin field effect transistors (FinFETs). A FinFET usually includes: fins protruding from a semiconductor substrate, gate structures covering a portion of top surfaces and sidewalls of the fins, a source in the fins on one side of each gate structure, and a drain in the fins on another side of each gate structure.

However, conventionally fabricated semiconductor devices including MOS transistors and FinFETs still have a poor performance. The disclosed devices and methods are directed to at least partially alleviate one or more problems set forth above and to solve other problems in the art.

SUMMARY

One aspect of the present disclosure provides a fabrication method for forming a semiconductor device. The method includes: providing a base substrate; providing a first dielectric layer on the base substrate with a first groove through the first dielectric layer; forming a first gate electrode in the first groove, with a top surface lower than a top surface of the first dielectric layer; forming a first protective layer on a portion of the top surface of the first gate electrode in the first groove; forming a compensating protective layer on a remaining portion of the top surface of the first gate electrode exposed by the first protective layer; and forming a second dielectric layer on the first protective layer, on the compensating protective layer and on the first dielectric layer. A material of the first protective layer has a first oxygen ionic concentration and a material of the compensating protective layer has a second oxygen ionic concentration. A material of the second dielectric layer has a third oxygen ionic concentration. The first oxygen ionic concentration and the second oxygen ionic are smaller than the third oxygen ionic concentration.

Another aspect of the present disclosure provides a semiconductor device. The semiconductor device includes: a base substrate; a first dielectric layer on the base substrate, with a first groove through the first dielectric layer; a first gate electrode in the first groove, with a top surface lower than a top surface of the first dielectric layer; a first protective layer on a portion of the top surface of the first gate electrode; a compensating protective layer on a remaining portion of the top surface of the first gate electrode; and a second dielectric layer on the first protective layer, on the compensating protective layer and on the first dielectric layer. The compensating protective layer and the first protective layer covers the entire top surface of the first gate electrode. A material of the first protective layer has a first oxygen ionic concentration and a material of the compensating protective layer has a second oxygen ionic concentration. A material of the second dielectric layer has a third oxygen ionic concentration. The first oxygen ionic concentration and the second oxygen ionic are smaller than the third oxygen ionic concentration.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like portions.

Figure 1:
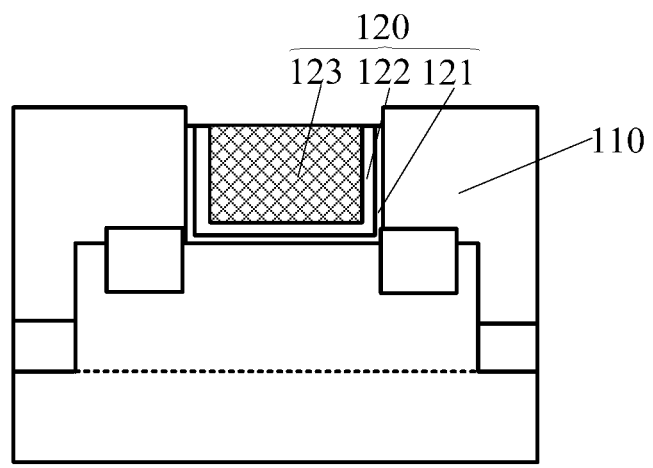
FIG. 1 to FIG. 3 illustrate semiconductor structures corresponding to certain stages for forming a semiconductor structure.
Figure 2:
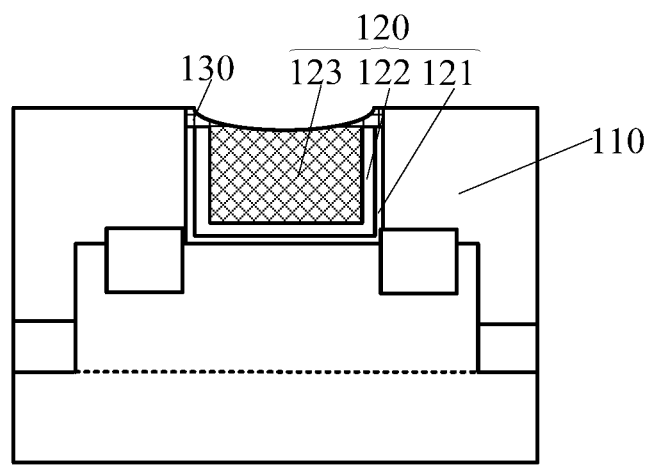
Figure 3:
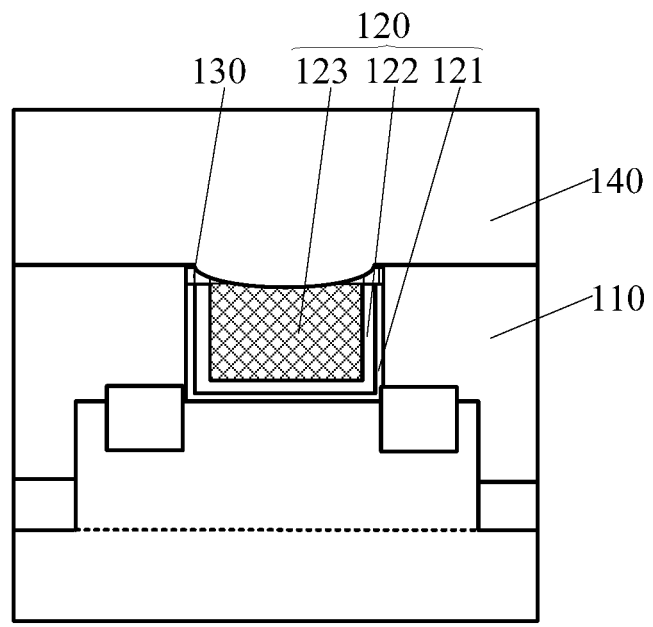

FIG. 1 to FIG. 3 illustrate semiconductor structures corresponding to certain stages for forming a semiconductor structure.

As illustrated in FIG. 1, a semiconductor substrate with a first dielectric layer 110 on the semiconductor substrate is provided. The first dielectric layer 110 has a groove through the first dielectric layer 110. A gate structure 120 with a top surface lower than a top surface of the first dielectric layer 110 is formed in the groove. The gate structure 120 includes a gate dielectric layer 121 on a bottom of the groove and on a portion of sidewalls of the groove, a work function layer 122 on the gate dielectric layer 121, and a gate electrode layer 123 on the work function layer 122. The gate electrode layer 123 is doped with fluorine ions or chlorine ions.

As illustrated in FIG. 2, a protective layer 130 is formed on a portion of the top surface of the gate structure 120, and exposes a portion of the top surface of the gate electrode layer 123.

As illustrated in FIG. 3, a second dielectric layer 140 is formed on the protective layer 130, on the gate electrode layer 123 and on the first dielectric layer 110.

However, the groove has a wide opening to form a transistor with a long channel, and the doping ions are introduced when forming the material layer of the gate electrode layer.

The protective layer 130 is used to protect the top surface of the gate electrode layer 123 during the manufacturing process. The protective layer 130 is formed by: forming an initial protective material layer on a top surface of the gate electrode layer 123 in the groove and on the top of the first dielectric layer 110; and polishing the initial protective material layer to expose the top surface of the first dielectric layer 110 and to form the protective layer 130, by a chemical mechanical polishing (CMP) process.

The CMP process for polishing the initial protective material layer may improve the flatness of the top surface of the first dielectric layer 110. However, the polishing process for the initial protective material layer requires a certain amount of over-polishing to make sure that all initial protective material layer on the top surface of the first dielectric layer in each region is removed. Moreover, a portion of the initial protective material layer in the groove is also removed in the polishing process.

Because of the large opening of the groove, the polishing pad used in the over-polishing process tends to bend toward the initial protective material layer in the groove and the bending degree is increased toward the center of the groove. The bent polishing pad may contact the initial protective material layer in the groove, and continuously polishing the initial protective material layer in the groove. Correspondingly, a portion of the top surface of the gate electrode layer 123 may be easily exposed and the gate electrode layer 123 may contact the second dielectric layer 140 after forming the second dielectric layer 140.

The second dielectric layer 140 is made of $SiO_2$. Subsequently, the doping ions in the gate electrode layer 123 will easily diffuse into the work function layer 122 and into the gate dielectric layer 121 on the bottom of the groove driven by the oxygen ions in the second dielectric layer 140. And the degree of the diffusion of the doping ions of the gate electrode layer 123 towards the work function layer 122 and toward the gate dielectric layer 121 on the bottom of the groove driven by the oxygen ions in the second dielectric layer 140 can be large because of a high concentration of the oxygen ions in the second dielectric layer 140. Subsequently, a large amount of doping ions will diffuse into the work function layer 122 and into the gate dielectric layer 121. When the doping ions are fluorine or chlorine ions, the doping ions will induce a large offset of the threshold voltage in the semiconductor device, and then will reduce the performance of the semiconductor device.

The present disclosure provides a semiconductor device and a method for fabricating the semiconductor device. The method of the present disclosure includes forming a compensating protective layer on the top surface of the first gate electrode layer exposed by the first protective layer, before forming the second dielectric layer. The material in the compensating protective layer has a second oxygen ionic concentration which is greater than or equal to zero.

FIG. 4 to FIG. 9 illustrate semiconductor structures corresponding to certain stages for forming an exemplary semiconductor device according to various disclosed embodiments of present disclosure. FIG. 10 illustrates an exemplary method for forming a semiconductor device according to various disclosed embodiments.

Figure 4:
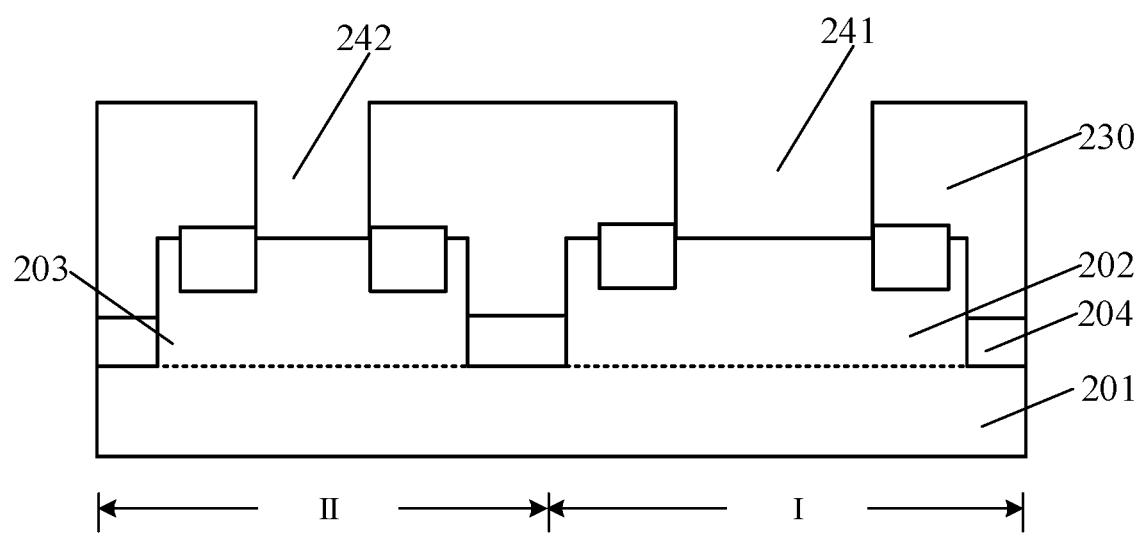
FIG. 4 to FIG. 9 illustrate semiconductor structures corresponding to certain stages for forming an exemplary semiconductor device according to various disclosed embodiments of the present disclosure.

As illustrated in FIG. 4, a base substrate with a first dielectric layer 230 on the base substrate, may be provided (e.g. Step S802 in FIG. 10). The first dielectric layer 230 may have a first groove 241 through the first dielectric layer 230.

For illustration purposes, a FinFET device may be described primarily in the present disclosure an example of the disclosed devices and their fabrication methods, although any other devices, e.g., a planar MOS transistor, may be formed using the disclosed methods according to various embodiments of the present disclosure.

In one embodiment, the base substrate may include a first region I and a second region II. A channel in the transistor formed by the first region I may have a length greater than a channel in the transistor formed by the second region II. In another embodiment, the base substrate may only include a first region I.

In one embodiment, the base substrate may include a semiconductor substrate 201 and fins protruding from the semiconductor substrate 201. In other embodiments, the base substrate may be a planar semiconductor substrate.

In various embodiments, the semiconductor substrate 201 may be made of a material including single crystalline silicon, polysilicon, amorphous silicon, germanium, SiGe, GaAs and/or another semiconductor material.

The fins may include a first fin 202 in the first region I and a second fin 203 in the second region II.

The base substrate may further include an isolation structure 204 on the semiconductor substrate 201. The isolation structure 204 may cover a portion of sidewalls of the fins and may have a top surface lower than top surfaces of the fins. The isolation structure 204 may be used to electrically insulate adjacent fins and may be made of $SiO_2$ or any suitable materials.

The first dielectric layer 230 may further include a second groove 242 through the first dielectric layer 230.

The second groove 242 may have an opening smaller than an opening of the first groove 241. In one embodiment, a size of the first groove 241 along a direction parallel to the top surface of the base substrate and perpendicular to the extending direction of the first groove 241 may be about 0.072 μm to about 1 μm, such as 0.075 μm, 0.080 μm, 0.090 μm or 1 μm; while a size of the second groove 242 along a direction parallel to the top surface of the base substrate and perpendicular to the extending direction of the second groove 242 may be about 0.010 μm to about 0.072 μm, such as 0.010 μm, 0.030 μm, 0.050 μm, 0.060 μm or 0.070 μm.

In one embodiment, the first groove 241 and the second groove 242 may each expose a portion of the sidewalls and a portion of the top surfaces of the fins. The first groove 241 may expose a portion of the sidewalls and a portion of the top surface of the first fin 202, and the second groove 242 may expose a portion of the sidewalls and a portion of the top surface of the second fin 203.

The first groove and second groove may be formed by: providing the base substrate; forming a first dummy gate structure (not illustrated) and a second dummy gate (not illustrated) structure on the base substrate; forming source-drain doping regions in the first fin 202 on two sides of the first dummy gate structure, and in the second fin 203 on two sides of the second dummy gate structure; after forming the source-drain doping regions, forming the first dielectric layer 230 on the base substrate to cover sidewalls of the first dummy gate structure and sidewalls of the second dummy gate structure; after forming the first dielectric layer 230, removing the first dummy gate structure and the second dummy gate structure to form the first groove 241 and the second groove 242 correspondingly.

The first dummy gate structure across the first fin 202 may cover a portion of the sidewalls and a portion of the top surface of the first fin 202. The second dummy gate structure across the second fin 203 may cover a portion of the sidewalls and a portion of the top surface of the second fin 203.

The first dummy gate structure may include a first dummy gate dielectric layer across the first fin 202 and a first dummy gate electrode layer on a top of the first dummy gate dielectric layer. The second dummy gate structure may include a second dummy gate dielectric layer across the second fin 203 and a second dummy gate electrode layer on a top of the second dummy gate dielectric layer.

In one embodiment, the first dummy gate electrode and the second dummy gate electrode layer may be made of polysilicon, and the first dummy gate dielectric layer and the second dummy gate dielectric layer may be made of $SiO_2$.

In other embodiments, the first dummy gate electrode layer may be removed to form the first groove, and the second dummy gate electrode layer may be removed to form the second groove. The first dummy gate dielectric layer and the second dummy gate dielectric layer may be used as the first gate dielectric layer and the second gate dielectric layer respectively, after forming the first and the second groove. The first dummy gate dielectric layer and the second dummy gate dielectric layer may be made of a high-k dielectric material with k greater than 3.9.

Figure 5:
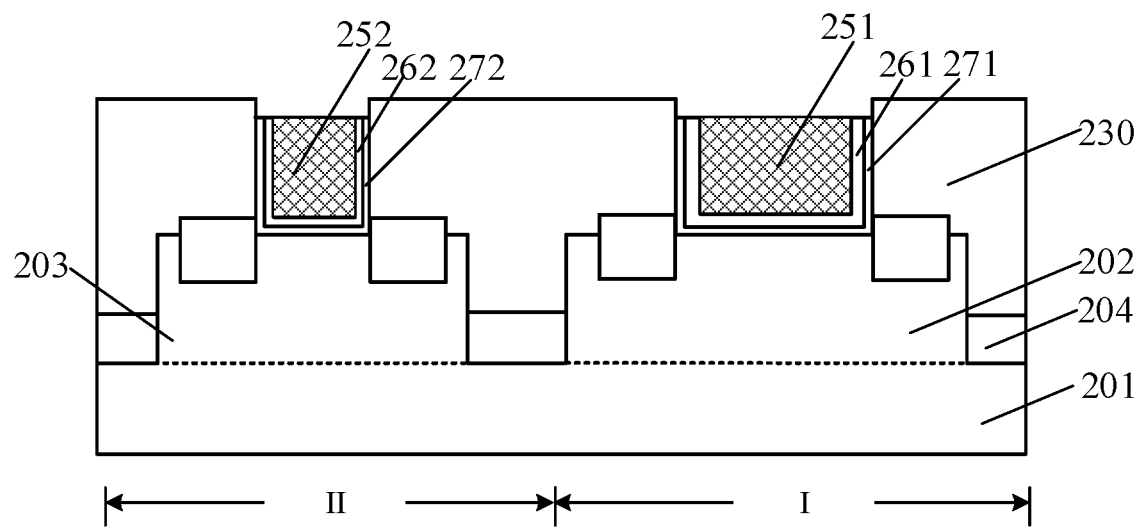

Referring to FIG. 5, a first gate electrode 251 may be formed in the first groove 241, and the first gate electrode 251 may have a top surface lower than the top surface of the first dielectric layer 230 (e.g., in Step S804 in FIG. 10).

In one embodiment, a second gate electrode 252 may be formed in the second groove 242 when forming the first gate electrode 251. The second gate electrode 252 may have a top surface lower than the top surface of the first dielectric layer 230.

In one embodiment, the first gate electrode 251 and the second gate electrode 252 may be doped with doping ions including fluorine or chlorine ions.

The top surface of the first gate electrode 251 may include a central region and an edge region around the central region.

The first gate electrode 251 and the second gate electrode 252 may be formed by: forming a gate electrode material layer in the first groove 241, in the second groove 242 and on the first dielectric layer 230; polishing the gate material layer to expose the top surface of the first dielectric layer 230, and to form a first initial gate electrode in the first groove 241 and a second initial gate electrode in the second groove 242; and etching the first initial gate electrode and the second initial gate electrode, to form the first gate electrode 251 from the first initial gate electrode and to form the second gate electrode 252 from the second initial gate electrode. The first gate electrode 251 may have a height smaller than a height of the first initial gate electrode, and the second gate electrode 252 may have a height smaller than a height of the second initial gate electrode.

The doping ions in the first gate electrode 251 and the second gate electrode 252 may be introduced when forming the gate material layer.

When polishing the gate material layer, a certain amount of over-polishing may be necessarily used to completely remove the gate material layer from the top surface of the first dielectric layer 230. The over-polishing process on the gate material layer may be referred as a first over-polishing process. The first over-polishing process may polish not only the gate material layer in the first groove 241 and the gate material layer in the second groove 242, but also the first dielectric layer 230. The first over-polishing process may easily cause scratches on the top surface of the first dielectric layer 230 because the first dielectric layer 230 may have a hardness smaller than the gate material layer. Correspondingly, it may be easy to inlay the material of the gate material layer into the top surface of the first dielectric layer 230 around the first groove 241 and into the top surface of the first dielectric layer 230 around the second groove 242 during and after the first over-polishing process. The material inlaid into the top surface of the first dielectric layer 230 around the first groove may be referred as a first inlaid material, and the material inlaid in the top surface of the first dielectric layer 230 around the second groove may be referred as a second inlaid material. The first inlaid material and the second inlaid material may have a strong bonding with the first dielectric layer 230. Correspondingly, a cleaning process may be hard to remove the first inlaid material and the second inlaid material from the top surface of the first dielectric layer. Subsequently, the first initial gate electrode may be connected to the first inlaid material and the second initial gate electrode may be connected to the second inlaid material.

In various embodiments, the first and the second initial gate electrode may be etched back to form the first gate electrode 251 and the second gate electrode 252. Correspondingly, the direct connection between the first gate electrode 251 and the first inlaid material may be avoided, and the leakage current between the first gate electrode 251 and a subsequent first plug may be reduced. Also, the direct connection between the second gate electrode 252 and the second inlaid material may be avoided, and the leakage current between the second gate electrode 252 and a subsequent second plug may be reduced.

In one embodiment, the gate material layer may be formed by a chemical vapor deposition process. When the doping ions are fluorine ions, the chemical vapor deposition process may use a gas including $WF_6$. When the doping ions are chlorine ions, the chemical vapor deposition process may use a gas including $WCl_6$.

The chemical vapor deposition process for forming the gate material layer may use a gas containing fluorine or chlorine to reduce a cost of the source gas and to reduce a cost of the process for forming the gate material layer.

The distance between the top surface of the first gate electrode 251 and the top surface of the first dielectric layer 230 may be referred as a first distance; while the distance between the top surface of the second gate electrode 252 and the top surface of the first dielectric layer 230 may be referred as a second distance. In various embodiments, the first distance and the second distance may be equal to or different from each other.

In one embodiment, the first distance may be about 5 nm to about 30 nm, and the second distance may be about 5 nm to about 30 nm.

In various embodiments: a first work function layer 261 and a first gate dielectric layer 271 may be formed. The first work function layer 261 may be formed on the bottom and a portion of the sidewalls of the first groove 241, and may have a top surface coplanar with the top surface of the first gate electrode 251. The first gate electrode 251 may be on the first work function layer 261. The first gate dielectric layer 271 may be formed on the bottom of the first groove 241 and between the first work function layer 261 and the base substrate. In one embodiment, the first gate dielectric layer 271 may also be formed on a portion of the sidewalls of the first groove 241 and between the first work function layer 261 and the first dielectric layer 230. In other embodiments, the first gate dielectric layer 271 may be formed on the bottom of the first groove and between the first work function layer and the base substrate.

In various embodiments, a second work function layer 262 and a second gate dielectric layer 272 may be formed. The second work function layer 262 may be formed on the bottom and a portion of the sidewalls of the second groove 242, and may have a top surface coplanar with the top surface of the second gate electrode 252. The second gate electrode 252 may be on the second work function layer 262. The second gate dielectric layer 272 may be formed on the bottom of the second groove 242 and between the second work function layer 262 and the base substrate. In one embodiment, the second gate dielectric layer 272 may also be formed on a portion of the sidewalls of the second groove 242 and between the second work function layer 262 and the first dielectric layer 230. In other embodiments, the second gate dielectric layer 272 may be formed on the bottom of the second groove and between the second work function layer and the base substrate.

Figure 6:
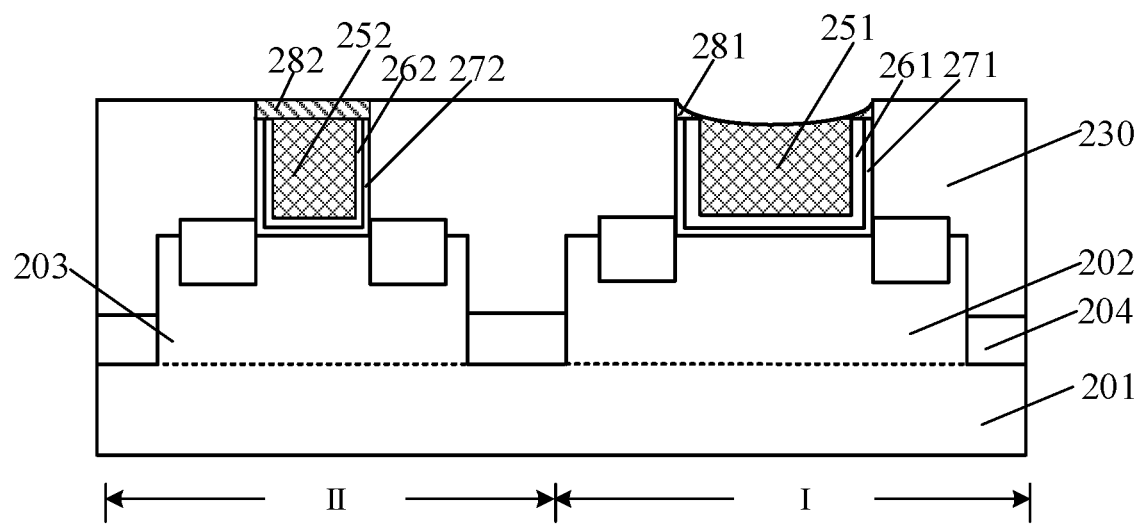

As illustrated in FIG. 6, a first protective layer 281 may be formed on a portion of the top surface of the first gate electrode 251 in the first groove 241 (e.g., in Step S806 in FIG. 10). The material of the first protective layer 281 may have a first oxygen concentration, e.g., greater than or equal to zero.

The first protective layer 281 may be made of a material including $Si_3N_4$, SiNO, SNCO, SiNBO and/or SiNCBO.

In various embodiments, a second protective layer 282 in the second groove 242 may be formed, when forming the first protective layer 281. The second protective layer 282 may cover the entire top surface of the second gate electrode 252 and may have the first oxygen ionic concentration.

The second protective layer 282 may be made of a material including $Si_3N_4$, SiNO, SNCO, SiNBO and/or SiNCBO.

In one embodiment, the first protective layer 281 may cover the edge region of the top surface in the first gate electrode 251, and may expose the central region of the top surface in the first gate electrode 251.

The first protective layer 281 and the second protective layer 282 may be formed by: forming an initial protective material layer (not shown) on the top surface of the first gate electrode 251, on the top surface of the second gate electrode 252 and on the top surface of the first dielectric layer 230; and polishing the initial protective material layer to expose the top surface and the central region of the first dielectric layer 230, to form the first protective layer 281 and the second protective layer 282.

In various embodiments, the process for polishing the initial protective layer may be a chemical mechanical polishing (CMP) process or an etching back process.

Using the CMP process to polish the initial protective material layer may improve the flatness of the top surface of the first dielectric layer 230, and enhance the exposure accuracy in the patterned first dielectric layer and in the patterned second dielectric layer when subsequently patterning the first dielectric layer and the second dielectric layer to form a first conductive hole and a second conductive hole.

The CMP process on the initial protective material layer requires a certain amount of over-polishing to make sure that all initial protective material layer on the top surface of the first dielectric layer is removed. The process for over-polishing the initial protective material layer may be referred to as a second over-polishing process. Moreover, a portion of the initial protective material layer in the first groove 241 and in the second groove 242 may be also removed in the second over-polishing process. The polishing pad in the second over-polishing process may bend toward the initial protective material layer in the first groove 241 and the bending degree may be greater toward the center of the first groove 241 than the degree toward the edge of the first groove 241, because the opening of the first groove 241 is greater than the opening of the second groove 242. The bent polishing pad may contact the initial protective material layer in the first groove 241, and continues polishing the initial protective material layer in the first groove 241. Correspondingly, a portion of the top of the first gate electrode 251 may be easily exposed.

The initial protective material layer may be also formed on the top surface of the first work function layer 261 and on the top surface of the second function layer 262. Correspondingly, the first protective layer 281 may be also formed on the top surface of the first work function layer 261 and the second protective layer may be also formed on the top surface of the second work function layer 262. In one embodiment, the initial protective material layer may be also formed on the top surface of the first dielectric layer 271 and on the top surface of the second dielectric layer 272.

Figure 7:
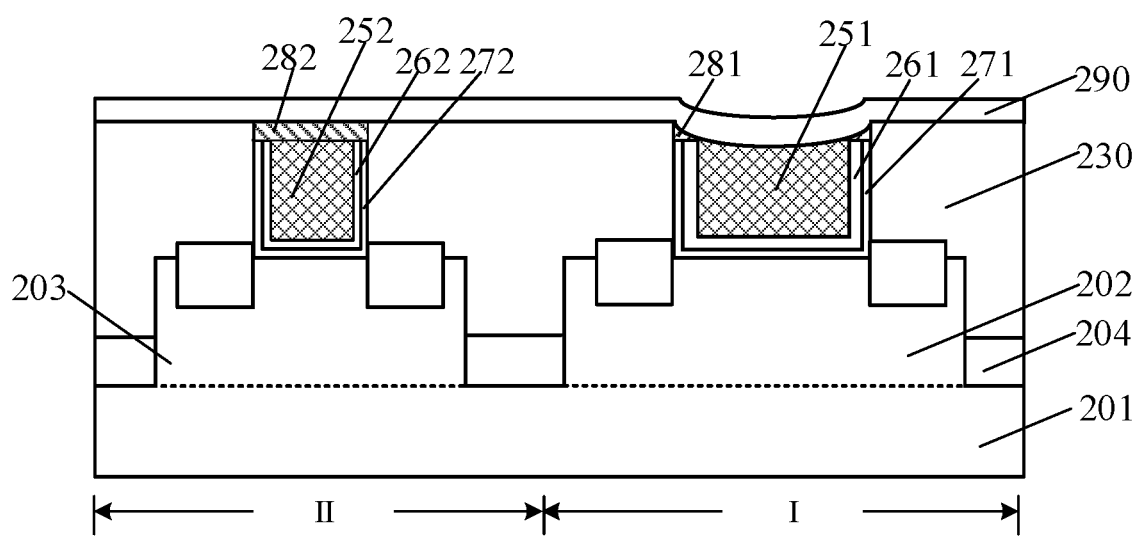

As illustrated in FIG. 7, a compensating protective layer 290 may be formed at least on the top surface of the first gate electrode 251 exposed by the first protective layer 281 (e.g., in Step S808 in FIG. 10). In one embodiment, the compensating protective layer 290 may be formed on the top surface of the first protective layer 281, on the top surface of the first dielectric layer 271, and on the top surface of the first gate electrode 251. In other embodiments, the compensating protective layer 290 may be formed only on the top surface of the first gate electrode 251 exposed by the first protective layer 281. The material of the compensating protective layer 290 may have a second oxygen ionic concentration, e.g., greater than or equal to zero.

The compensating protective layer 290 and the first protective layer 281 may cover the entire top surface of the first gate electrode 251.

The compensating protective layer 290 may be made of a material including $Si_3N_4$, SiNO, SiNCO, SiNBO and/or SiNCBO.

The compensating protective layer 290 may also be formed on the top surface of the first protective layer 281, on the top surface of the second protective layer 282, and on the top surface of the first dielectric layer 230.

The compensating protective layer 290 may be formed by a deposition process, such as an atomic layer deposition process, a plasma chemical vapor deposition process or a low-pressure chemical vapor deposition process.

Figure 8:
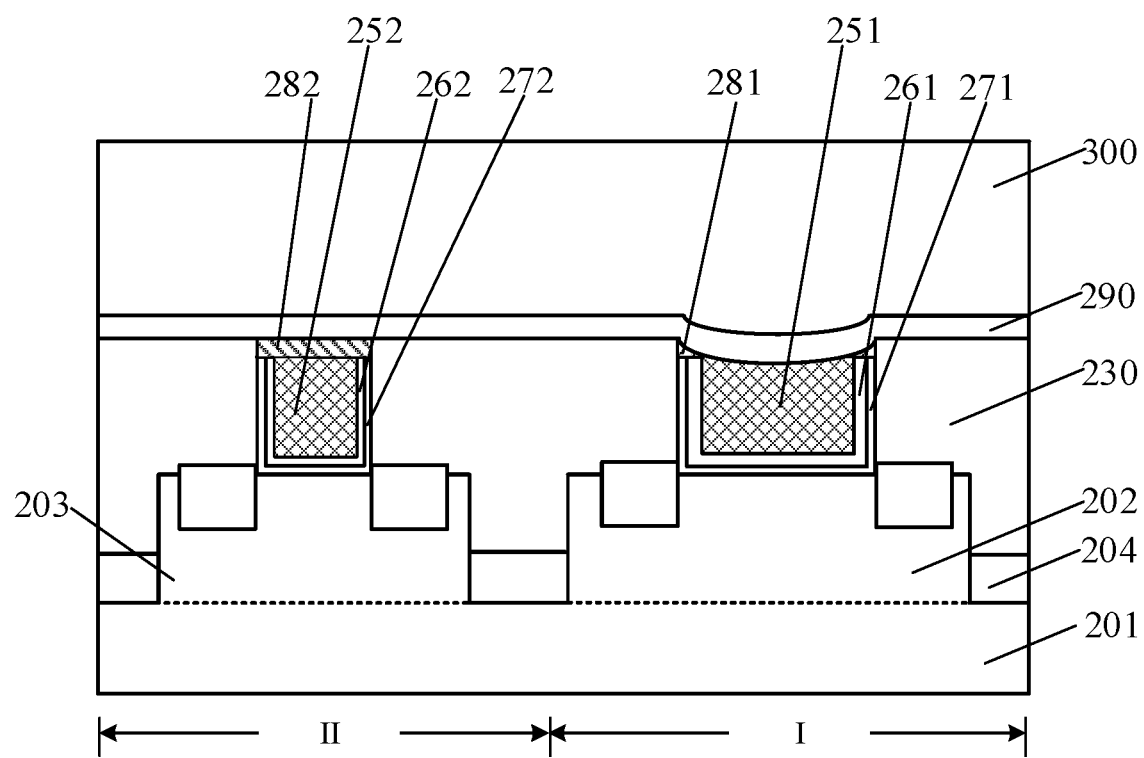

As illustrated in FIG. 8, a second dielectric layer 300 may be formed. In one embodiment, the compensating protective layer 290 may be formed on the top surface of the first protective layer 281, on the top surface of the first dielectric layer 271, and on the top surface of the first gate electrode 251, and the second dielectric layer 300 may be formed on the compensating protective layer 290. In another embodiment, the compensating protective layer 290 may be formed only on the top surface of the first gate electrode 251 exposed by the first protective layer 281, and the second dielectric layer 300 may be formed on the first protective layer 281, on the compensating protective layer 290 and on the first dielectric layer 230 (e.g., in Step S810 in FIG. 10). The second dielectric layer 300 may contain oxygen ions and have a third oxygen ionic concentration. Both the first oxygen ionic concentration and the second oxygen ionic concentration may be smaller than the third oxygen ionic concentration.

The second dielectric layer may be also formed on the second protective layer 282.

In one embodiment, the second dielectric layer may be also formed on the compensating protective layer 290.

The second dielectric layer 300 may be made of $SiO_2$.

The second dielectric layer 300 may be formed by a deposition process such as a plasma chemical vapor deposition process.

Figure 9:
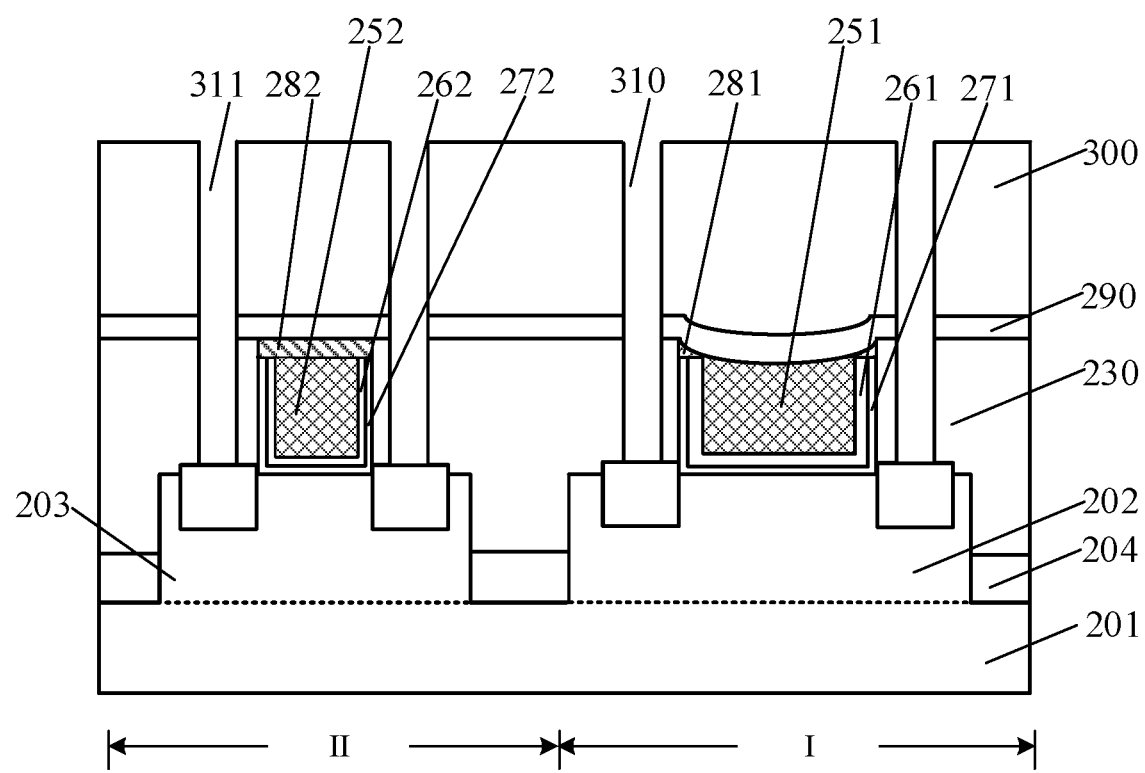
Figure 10:
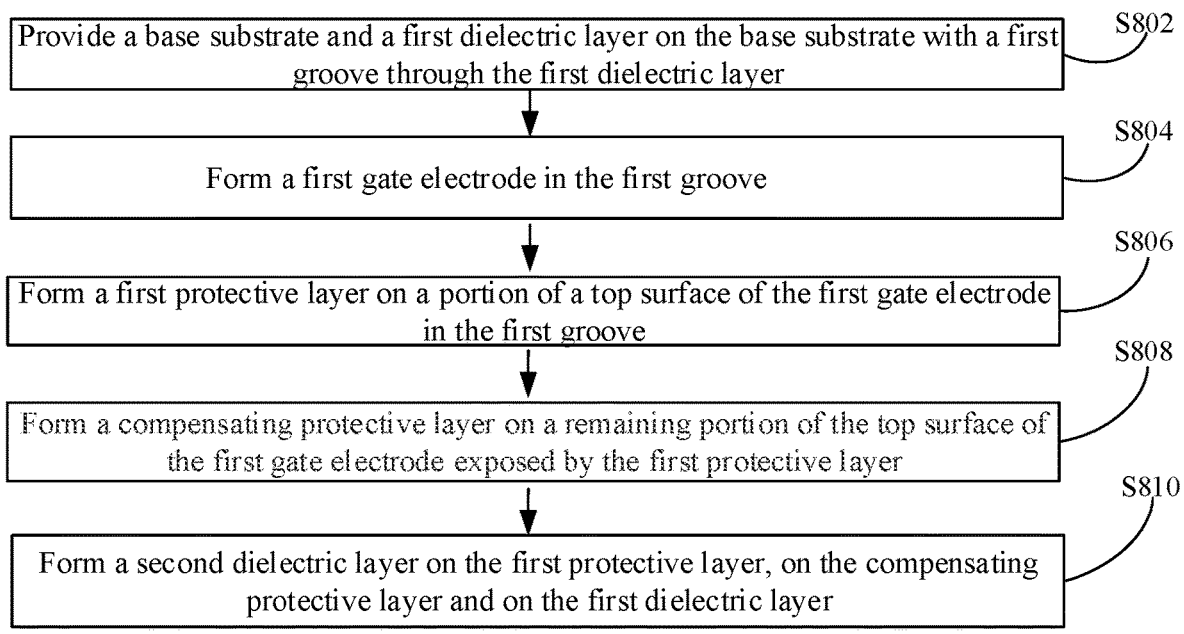
FIG. 10 illustrates an exemplary method for forming a semiconductor device according to various disclosed embodiments of the present disclosure.

As illustrated in FIG. 9, a first contact hole 310 may be formed through the first dielectric layer 230 and through the second dielectric layer 300; and a second contact hole 311 may be formed through the first dielectric layer 230 and through the second dielectric layer 300. A first contact plug (not shown) may be formed in the first contact hole 310, and a second contact plug (not shown) may be formed in the second contact hole 311. The first contact hole 310 may be located on both sides of the first gate electrode 251, and the second contact hole 311 may be located on both sides of the second gate electrode 252.

Various embodiments also provide a semiconductor device, as shown in FIG. 8. In one embodiment, the semiconductor device may include: a base substrate; a first dielectric layer 230 on the base substrate with a first groove 241 through the first dielectric layer 230; a first gate electrode 251 with a top surface is lower than the top surface of the first dielectric layer 230 in the first groove 241; a first protective layer 281 in the first groove 241 and on a portion of the top surface of the first gate electrode 251; a compensating protective layer 290 on a portion of the top surface of the first gate electrode 251; and a second dielectric layer 300 on the compensating protective layer 290. The first protective layer 281 may be located on a portion of the top surface of the first gate electrode 251 and may have a first oxygen ionic concentration, e.g., greater than or equal to zero. The compensating protective layer 290 may cover the entire top surface including the first gate electrode 251 and the first protective layer 281, and may have a second oxygen ionic concentration greater than or equal to zero. The second dielectric layer 300 may contain oxygen ions and have a third oxygen ionic concentration. Both the first oxygen ionic concentration and the second oxygen ionic concentration may be smaller than the third oxygen ionic concentration.

The first protective layer 281 may be made of a material including $Si_3N_4$, SiNO, SiNCO, SiNBO and/or SiNCBO. The compensating protective layer 290 may be made of a material including $Si_3N_4$, SiNO, SiNCO, SiNBO and/or SiNCBO.

The second dielectric layer 300 may be made of $SiO_2$, or any suitable materials.

The first gate electrode 251 may be doped with doping ions including fluorine ions and/or chlorine ions.

The first dielectric layer 230 may further include a second groove 242 through the first dielectric layer 230. An opening of the second groove 242 is smaller than an opening of the first groove 241.

In one embodiment, a size of the first groove 241 along a direction parallel to the top surface of the base substrate and perpendicular to the extending direction of the first groove 241 may be about 0.072 µm to about 1 µm, such as 0.075 µm, 0.080 µm, 0.090 µm or 1 µm; while a size of the second groove 242 along a direction parallel to the top surface of the base substrate and perpendicular to the extending direction of the second groove 242 may be about 0.010 µm to about 0.072 µm, such as 0.010 µm, 0.030 µm, 0.050 µm, 0.060 µm or 0.070 µm.

A top surface of the first gate electrode 251 may include a central region and an edge region surrounding the central region. The first protective layer 281 may cover the edge region of the first gate electrode 251 and expose the central region of the first gate electrode 251.

The semiconductor device may further include a second gate electrode 252 in the second groove 242 and a second protective layer 282 in the second groove 242. The second gate electrode 252 may have a top surface lower than the top surface of the first dielectric layer 230. The second protective layer 282 may completely cover the top surface of the second gate electrode 252. A material of the second protective layer 282 may have the first oxygen ionic concentration. The second dielectric layer 300 may be also located on the second protective layer 282.

The second protective layer 282 may be made of a material including $Si_3N_4$, SiNO, SNCO, SiNBO and/or SiNCBO.

The second protective layer 282 may be doped with doping ions.

The compensating protective layer 290 may be also located on the top surface of the first protective layer 281, on the top surface of the second protective layer 282 and on the top surface of the first dielectric layer 230. The second dielectric layer 300 may be located on the top surface of the compensating protective layer 290.

The semiconductor device may further include: a first work function layer 261 on the bottom and a portion of the sidewalls of the first groove 241, a first gate dielectric layer 271 on the bottom of the first groove 241 and between the first work function layer 261 and the base substrate, a second work function layer 262 may be formed on the bottom and a portion of the sidewalls of the second groove 242, and a second gate dielectric layer 272 on the bottom of the second groove 242 and between the second work function layer 262 and the base substrate. The first work function layer 261 may have a top surface coplanar with the top surface of the first gate electrode 251. The first gate electrode 251 may be on the first work function layer 261. The second work function layer 262 may have a top surface coplanar with the top surface of the second gate electrode 252. The second gate electrode 252 may be on the second work function layer 262.

In the methods for forming semiconductor devices provided by various embodiments of the present disclosure, doping ions may be introduced into the material of the first gate electrode, and may diffuse easily under a driving of the oxygen ions. The compensating protective layer may be formed on a portion of the top surface of the first gate electrode. The compensating protective layer and the first protective layer may cover the entire top surface of the first gate electrode. Correspondingly, the first gate electrode may be in contact with the compensating protective layer and the first protective layer, but may not contact the second dielectric layer. The diffusion of the doping ions in the first gate electrode toward the bottom of the first groove under the driving of the oxygen ions in the second dielectric layer, may be avoided, and an influence of the doping ions on other material layers on the bottom of the first groove may be alleviated. Ultimately, the performance of the semiconductor device may be improved.

In the semiconductor devices provided by various embodiments of the present disclosure, doping ions may be introduced in the material of the first gate electrode, and may diffuse easily under a driving of the oxygen ions. The compensating protective layer and the first protective layer may cover the entire top surface of the first gate electrode. Correspondingly, the first gate electrode may contact the compensating protective layer and the first protective layer, while the first gate electrode and the second dielectric layer may not contact each other. The material of the first protective layer may have the first oxygen ionic concentration, and the material of the compensating protective layer may have the second oxygen ionic concentration. Both the first oxygen ionic concentration and the second oxygen ionic concentration may be smaller than the third oxygen ionic concentration. Correspondingly, when the top surface of the first gate electrode contacts the compensating protective layer and the first protective layer, the diffusion of the doping ions in the first gate electrode toward the bottom of the first groove under the driving of the oxygen ions in the second dielectric layer, may be avoided, and an influence of the doping ions on other material layers on the bottom of the first groove may be alleviated. Ultimately, the performance of the semiconductor device may be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:
1. A semiconductor device, comprising:
a base substrate;
a first dielectric layer on the base substrate, with a first groove through the first dielectric layer and a second groove through the first dielectric layer with an opening smaller than an opening of the first groove;
a first gate electrode in the first groove, with a top surface lower than a top surface of the first dielectric layer;
a second gate electrode in the second groove, with a top surface lower than the top surface of the first dielectric layer;
a first protective layer on a portion of the top surface of the first gate electrode, the first protective layer having a first oxygen ionic concentration;
a second protective layer in the second groove to cover the entire top surface of the second gate electrode;
a compensating protective layer on a remaining portion of the top surface of the first gate electrode exposed by the first protective layer, on the top surface of the first protective layer, on the top surface of the second protective layer and on the top surface of the first dielectric layer, the compensating protective layer having a second oxygen ionic concentration and completely covering the remaining portion of the top surface of the first gate electrode, wherein the compensating protective layer has a protruion going through the first protective layer to be in directly contact with the first gate electrode and the first protective layer; and
a second dielectric layer on the first protective layer, on the second protective layer, on the compensating protective layer and on the first dielectric layer, wherein a material of the second dielectric layer has a third oxygen ionic concentration greater than each of the first oxygen ionic concentration and the second oxygen ionic concentration.
2. The semiconductor device according to claim 1, wherein:

the first protective layer is made of a material including $Si_3N_4$, SiNO, SiNCO, SiNBO, SiNCBO, or a combination thereof;
the compensating protective layer is made of a material including $Si_3N_4$, SiNO, SiNCO, SiNBO, SiNCBO, or a combination thereof; and
the second dielectric layer is made of a material including $SiO_2$.
3. The semiconductor device according to claim 1, wherein:
the first gate electrode is doped with doping ions including one or more of fluorine ions and chlorine ions.
4. The semiconductor device according to claim 1, wherein:
the top surface of the first gate electrode includes a central region and an edge region surrounding the central region; and
the first protective layer covers the edge region of the first gate electrode and exposes the central region of the first gate electrode.
5. The semiconductor device according to claim 1, wherein:
a material of the second protective layer has the first oxygen ionic concentration.
6. The semiconductor device according to claim 5, wherein:
the second protective layer is made of a material including $Si_3N_4$, SiNO, SiNCO, SiNBO, SiNCBO, or a combination thereof.
7. The semiconductor according to claim 5, wherein:
the second dielectric layer is located on the top surface of the compensating protective layer.
8. The semiconductor device according to claim 5, further including:
a first work function layer;
a first gate dielectric layer on the first work function layer;
a second work function layer; and
a second gate dielectric layer on the second work function layer,
wherein:
the first work function layer is located on a bottom and on a portion of the sidewalls of the first groove;
the first work function layer has a top surface coplanar with the top surface of the first gate electrode;
the first gate dielectric layer is located on the bottom of the first groove, and between the base substrate and the first work function layer;
the second work function layer is located on a bottom and on a portion of the sidewalls of the second groove;
the second work function layer has a top surface coplanar with the top surface of the second gate electrode; and
the second gate dielectric layer is located on the bottom of the second groove and between the base substrate and the second work function layer.
9. A method for fabricating a semiconductor device, comprising:
providing a base substrate;
providing a first dielectric layer on the base substrate, the first dielectric layer having a first groove through the first dielectric layer;
forming a second groove through the first dielectric layer with an opening smaller than an opening of the first groove;
forming a first gate electrode in the first groove, with a top surface lower than a top surface of the first dielectric layer;

forming a second gate electrode in the second groove when forming the first gate electrode, wherein the second gate electrode has a top surface lower than the top surface of the first dielectric layer;

forming a first protective layer on a portion of the top surface of the first gate electrode, the first protective layer having a first oxygen ionic concentration;

forming a second protective layer in the second groove to cover the top surface of the second gate electrode;

forming a compensating protective layer on a remaining portion of the top surface of the first gate electrode exposed by the first protective layer, on the top surface of the first protective layer, on the top surface of the second protective layer and on the top surface of the first dielectric layer, the compensating protective layer having a second oxygen ionic concentration, wherein the compensating protective layer has a protruion going through the first protective layer to be in directly contact with the first gate electrode and the first protective layer; and forming a second dielectric layer on the first protective layer, on the second protective layer, on the compensating protective layer, and on the first dielectric layer, wherein a material of the second dielectric layer has a third oxygen ionic concentration, greater than each of the first oxygen ionic concentration and the second oxygen ionic concentration.

10. The method according to claim 9, wherein:

the first protective layer is made of a material including $Si_3N_4$, SiNO, SiNCO, SiNBO, SiNCBO, or a combination thereof;

the compensating protective layer is made of a material including $Si_3N_4$, SiNO, SiNCO, SiNBO, SiNCBO, or a combination thereof; and the second dielectric layer is made of a material including $SiO_2$.

11. The method according to claim 9, wherein:

the first gate electrode is doped with doping ions including one or more of fluorine ions and chlorine ions.

12. The method according to claim 9, wherein:

a material of the second protective layer has the first oxygen ionic concentration.

13. The method according to claim 12, wherein the first protective layer is formed by:

forming an initial protective material layer on the top surface of the first gate electrode, on the top surface of the second gate electrode, and on the surface of the first dielectric layer; and polishing the initial protective material layer by a chemical mechanical polishing process, to expose the central region of the first gate electrode and the top surface of the first dielectric layer, and to form the first protective layer.

14. The method according to claim 12, wherein the first gate electrode and the second gate electrode are formed by:

forming a gate electrode material layer in the first groove, in the second groove and on the first dielectric layer;

polishing the gate electrode material layer to expose the top surface of the first dielectric layer, and to form the first initial gate electrode in the first groove and the second initial gate electrode in the second groove; and etching back the first initial gate electrode and the second initial gate electrode, to form the first gate electrode from the first initial gate electrode and to form the second gate electrode from the second initial gate electrode.

15. The method according to claim 14, wherein the gate electrode material layer is formed by a chemical vapor deposition process;

when the doping ions are fluorine ions, the chemical vapor deposition process uses a gas including $WF_6$; and when the doping ions are chlorine ions, the chemical vapor deposition process uses a gas including $WCl_6$.

16. The method according to claim 15, wherein:

the second dielectric layer is formed on the compensating protective layer.

17. The method according to claim 16, wherein:

the compensating protective layer is formed by an atomic layer deposition process, a plasma chemical vapor deposition process or a low-pressure chemical vapor deposition process.

18. The method according to claim 12, further including:

forming a first work function layer and a first gate dielectric layer on the first work function layer; and forming a second work function layer and a second gate dielectric layer on the second work function layer, wherein:

the first work function layer is located on a bottom and on a portion of the sidewalls of the first groove;

the first work function layer has a top surface coplanar with the top surface of the first gate electrode;

the first gate dielectric layer is located on the bottom of the first groove and between the base substrate and the first work function layer;

the second work function layer is located on a bottom and on a portion of the sidewalls of the second groove;

the second work function layer has a top surface coplanar with the top surface of the second gate electrode; and the second gate dielectric layer is located on the bottom of the second groove and between the base substrate and the second work function layer.

19. The semiconductor device according to claim 1, wherein:

a thickness of the first protective layer increases as being closer to a sidewall of the first groove and the first protective layer exposes the remaining portion of the top surface of the first gate electrode.

* * * * *